United States Patent [19]

Asami et al.

[11] 4,400,615
[45] Aug. 23, 1983

[54] PROGRAMMABLE COUNTER CIRCUIT

[75] Inventors: Fumitaka Asami, Kunitachi; Osamu Takagi, Tokyo, both of Japan

[73] Assignee: Fujitsu Limited, Kanagawa, Japan

[21] Appl. No.: 217,386

[22] Filed: Dec. 17, 1980

[30] Foreign Application Priority Data

Dec. 17, 1979 [JP] Japan .................. 54-163796

[51] Int. Cl.$^3$ .................................. G06F 7/68
[52] U.S. Cl. ............................. 377/28; 377/51; 377/52
[58] Field of Search ............. 235/92 PE; 328/48; 377/52

[56] References Cited

U.S. PATENT DOCUMENTS 4,158,767  6/1979  Long .................. 235/92 PE

FOREIGN PATENT DOCUMENTS 52-141165  5/1976  Japan .
53-23262   3/1978  Japan ............ 235/92 PE
53-44165   4/1978  Japan .
54-48475   4/1979  Japan ............ 235/92 PE
55-68739   5/1980  Japan ............ 235/92 PE Primary Examiner—David H. Malzahn
Attorney, Agent, or Firm—Staas & Halsey

[57] ABSTRACT

In order to improve the operable frequency of a programmable counter circuit which serves as an N-step counter by loading an initial value N, load terminals of flip-flops of respective stages forming the counter circuit are sequentially cascade-connected via buffers and a load signal is applied to each of the load terminals from a load signal generator circuit. The load signal generator circuit includes a detector circuit which detects a specified value which is provided a short time before the initial value loading of the counter circuit and generates a detected output signal. The detected output signal is shifted by a shift register included in the load signal generator circuit which operates on the same clock signal as that which drives the counter circuit, thereby generating the load signal at the moment of the initial value loading of the counter circuit. In this case, for the duration of the load signal and a certain period of time subsequent thereto the application of the output from the detector circuit to the shift register is inhibited by a load control circuit included within the load signal generator circuit, thus preventing erroneous loading.

11 Claims, 10 Drawing Figures

PROGRAMMABLE COUNTER CIRCUIT

BACKGROUND OF THE INVENTION

1. Field of the Invention

The present invention relates to a programmable counter circuit which has its operable frequency improved.

2. Description of the Prior Art

A programmable counter which operates as an N-step counter having a variable frequency dividing ratio N, is composed of a counter circuit comprising a multistage connection of flip-flops and a loading circuit for inputting an initial value (N) into the counter circuit. FIG. 1 shows an example of a conventional programmable counter circuit indicated generally by CNT, in which a plurality of stages of flip-flops $P_{D1}$, $P_{D2}$, ... are cascade-connected. The flip-flop $P_{D1}$ of the first stage is supplied with a clock signal $F_{IN}$. The flip-flops $P_{D2}$, $P_{D3}$, ... of the following stages are each supplied with the output from the immediately preceding stage and bits $DL_1$, $DL_2$, $DL_3$, ... forming initial values are respectively loaded into the respective flip-flops of the individual stages. The bits $DL_1$, $DL_2$, $DL_3$, ... are bits of binary numbers and representing the numeric values of the first, second, fourth, eighth, ... digits in sequential order. For loading the initial values $DL_1$, $DL_2$, ... in the counter circuit CNT, the numeric values of the bits $DL_1$, $DL_2$, ... are first determined by setting digital switches or latch circuits and then a load signal LOAD is applied to a common line $L_1$, by which the numeric values $DL_1$, $DL_2$, ... are respectively loaded into the flip-flops $P_{D1}$, $P_{D2}$, .... The clock counting of the flip-flops is down-counting. Assuming, for example, that the initial values $DL_1$, $DL_2$, ... are "000100 ... ",that is "8" in the decimal notation, an "8" count is counted by loading 8 into the counter and counting down to 7, 6, ... by the down-counting of the clock signal $F_{IN}$ and when the count value reaches "0", "8" has been counted by the counter; thus, in this case, the counter serves as an 8-step counter. By setting the initial value to "20" with the bits $DL_1$, $DL_2$, ... set to "0010100 ... " and performing the counting as mentioned above, the counter functions as a 20-step counter. In this way, a desired counter can be formed.

Basically a load signal generator may be one that generates the load signal LOAD when the count value of the counter circuit CNT becomes zero. When the counter circuit CNT is counted down to "0" and it is detected by a gate circuit that outputs $Q_1$, $Q_2$, $Q_3$, ... $Q_{12}$ of the flip-flops $P_{D1}$, $P_{D2}$, $P_{D3}$, ... $P_{D12}$ are all "0", the detected output is directly used as the load signal LOAD. When the initial value bits $DL_1$, $DL_2$, ... are loaded into some of the flip-flops $P_{D1}$, $P_{D2}$, ... by the load signal, the above-mentioned condition required for load signal generation is immediately removed. Note, there is a slight time lag in the loading of the bits to the respective flip-flops. Thus, the load signal LOAD disappears, so that the initial values can no longer be loaded into the remaining flip-flops. To improve this above-mentioned system, it is common practice in the art to employ a signal generator LDG such as shown in FIG. 3 which is commonly referred to as an early decoder or look ahead circuit. This look ahead circuit comprises a specific count value detector circuit DET comprising NOR gates $NOR_1$ to $NOR_4$ and NAND gates $NAND_1$ to $NAND_4$ and a shift register SHR comprising D flip-flops $DFF_1$ to $DFF_3$. The detector circuit DET is one in which a Q or $\overline{Q}$ output from the counter circuit CNT is selectively applied to each gate to derive from NAND gate $NAND_4$ of the last stage the following output $\widehat{H}$:

$$\widehat{H} = Q_1 + Q_2 + \overline{Q_3} + Q_4 + \ldots + Q_{12}.$$

Accordingly, in the detector DET of this example the output $\widehat{H}$ is "0" when $Q_1 = Q_2 = Q_4 = \ldots = Q_{12} = 0$ and $Q_3 = 1$, that is, when the counter value is "4". The output $\widehat{H} = 0$ is applied as a detection signal of the specific count value "4" to the shift register SHR. The shift register SHR inputs therein the output from the gate $NAND_4$, using the same clock signal $F_{IN}$ as the counter circuit CNT, and then after having shifted for three clock signals and, accordingly when the count value of the counter circuit CNT has reached "1", the shift register SHR generates the load signal LOAD. With this system, each flip-flop is initialized by the load signal and even if the output from the NAND gate $NAND_4$ is made $\widehat{H} = 1$ by the initialization, since it is the shift register SHR that outputs the load signal and since the shift register SHR does not change its state for at least one clock signal, the load signal will not disappear within one clock period; thus, the load signal is produced until the count value "0" is reached.

In such a programmable counter, as its operating frequency is raised, the load circuit cannot keep up with the increase in the operating fequency even though each flip-flop is still operable, presenting the problem that the highest operating frequency is limited. In other words, as the number of stages of flip-flops increases, the load signal line $L_1$ becomes longer; especially in a MOS circuit, the capacitance of the signal line $L_1$ increases and rounds the waveform of the load signal transmitted over the signal line $L_1$, introducing the possibility of an erroneous operation.

The rounding of the waveform can be avoided by applying the load signal to a waveform shaping circuit. The circuit arrangement therefor is shown in FIG. 2. In the illustrated example, a buffer BUF formed by a series connection of two inverters is shown to be inserted between load terminals of every other flip-flop. With such an arrangement, the load signal is applied only to the first stage flip-flop $P_{D1}$ and the buffer BUF connected thereto and each of the other buffers drives the flip-flop of the succeeding stage and the buffer connected thereto, so that the load on the load signal generator LDG is greatly alleviated and the rounding of the waveform is removed by each buffer and hence does not become critical. With this arrangement, however, a delay in signal propagation by each buffer is accumulated producing a large delay in the signal propagation of the signal arriving at the terminating flip-flop and, as a result, it is likely that a plurality of load signals occur, making the loading inaccurate. Accordingly, in the circuit of FIG. 2 the highest operating frequency depends on the delay of the load circuit; therefore, an extensive improvement cannot be expected of this circuit though it slightly improves on the circuit of FIG. 1. This will hereinbelow be further described with reference to FIGS. 4 and 5.

FIG. 4 is a waveform diagram depicting the operation of the programmable counter shown in FIG. 2. In FIG. 4, $DL_3 = DL_6 = 1$ and the other bits are "0"; that is, the initial value is "36". Assuming that the level of the output $\widehat{H} = 0$ from the gate $NAND_4$ is produced upon occurrence of a second clock signal $F_{IN}$ in FIG. 2, a low-level load signal is generated after the occurrence of three clock signals and the initial values $DL_1$, $DL_2$, . . . are loaded into the flip-flops $P_{D1}$, $P_{D2}$, . . . in a sequential order while being delayed by a signal propagation delay time $\tau_1$. By the loading of the initial value $DL_1$, the flip-flop $P_{D1}$ is returned to the low level although it is to be high-level, and the NAND gate $NAND_4$ provides an output $H_2$ having a low-level other than its original output $H_1$. The high-level of $(H)$ is immediately restored by the lowering of the output G down to the low level, as indicated by $G_1$, so that the loading does not take place twice. Thus, in the case where the initial value is not a certain special value, normal operation is maintained even if the operating frequency is a little high. When loading an initial value such that $DL_3 = 1$ and a high-order bit becomes "1" as indicated by $Q_{12}$ in FIG. 5, however, while the loading signal is transmitted to the flip-flop $P_{D12}$, "1" is loaded into the flip-flop $P_{D3}$ and there can occur the state in which the outputs from the remaining flip-flops are "0". Since this means a count value "4", the NAND gate $NAND_4$ yields a low-level output $H_2$ and after three clock signals the shift register SHR produces a load signal LOAD'.

SUMMARY OF THE INVENTION

The present invention is directed to a programmable counter circuit which utilizes the merits of the counter circuit of the type having buffers inserted in the load signal line but is free from its problems.

It is an object of the present invention to ensure accurate loading in a programmable counter.

Another object of the present invention is to speed up the counter operation of a programmable counter.

Yet another object of the present invention is to raise the operating frequency of a programmable counter into the vicinity of the operational limit of flip-flops comprising the counter.

Briefly stated, according to the present invention, in a programmable counter circuit, in the loading of an initial value, a load signal is applied from a load signal generator via a buffer to flip-flops of each stage of a counter, which counter serves as an N-step counter dependent on the initial value to be loaded. The load signal generator includes a detector circuit for detecting a specified value which is generated a short time before the initial value loading of the counter circuit. The load signal generator also includes, a shift register which shifts upon reception of the detected output signal from the detector circuit under the control of the same clock signal as that for driving the counter circuit and generates the load signal at the moment of the initial value loading of the counter circuit. The load signal generator further includes a load control circuit which sends out a signal for preventing the application of the output from the detector circuit to the shift register for the duration of the load signal and a certain period of time subsequent thereto.

DESCRIPTION OF THE PREFERRED EMBODIMENTS

Figure 6:
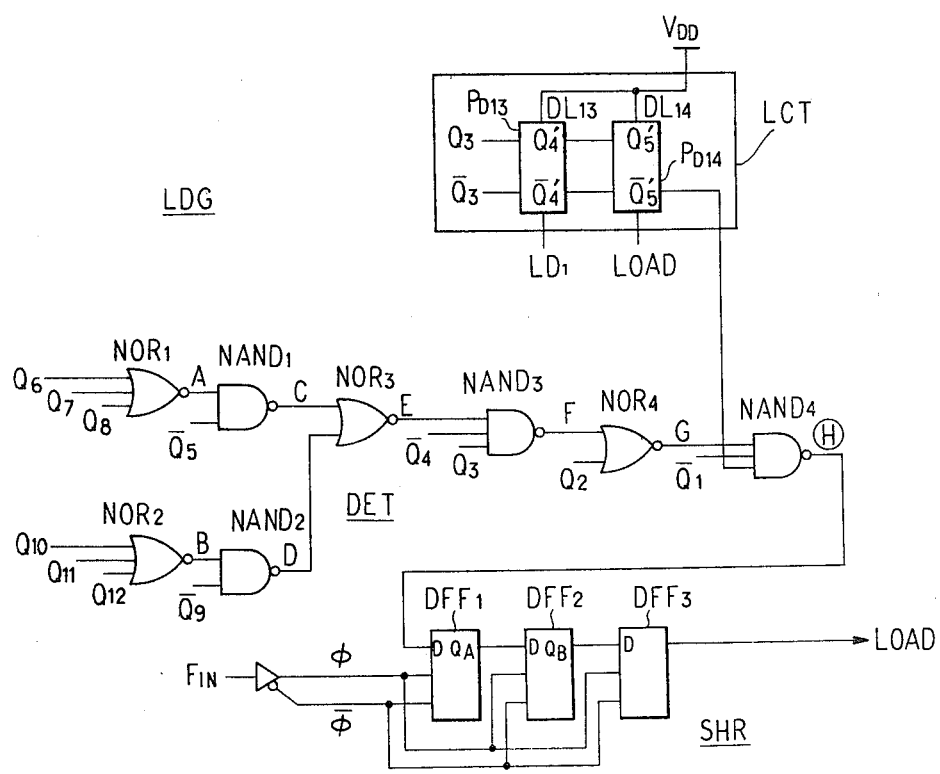
FIG. 6 is a block diagram illustrating a load signal generator circuit in accordance with an embodiment of the present invention.

FIG. 6 shows the principal part of an embodiment of the present invention, that is, an improved load signal generator circuit LDG. The present invention comprises a programmable counter having a combination of this load signal generator circuit and the counter circuit CNT of FIG. 2. A specific count value detector circuit DET and a shift register SHR in FIG. 6 are the same as those used in FIG. 3 and, in this embodiment, a load control circuit LCT is added. The load control circuit LCT is a dummy counter which is formed by 2-bit flip-flops $P_{D13}$ and $P_{D14}$. A $\overline{Q}$ output $\overline{Q_5'}$ of the flip-flop $P_{D14}$ is connected to one input of the NAND gate $NAND_4$ to set a limit to a period during which the detector circuit DET applies the detected output $(H)$ to the shift register SHR; that is, for the duration of the load signal LOAD and a certain period of time subsequent thereto, the NAND gate $NAND_4$ is closed in order to hold the output $(H)$ at the high-level (not by the output G from the preceding stage).

Figure 1:
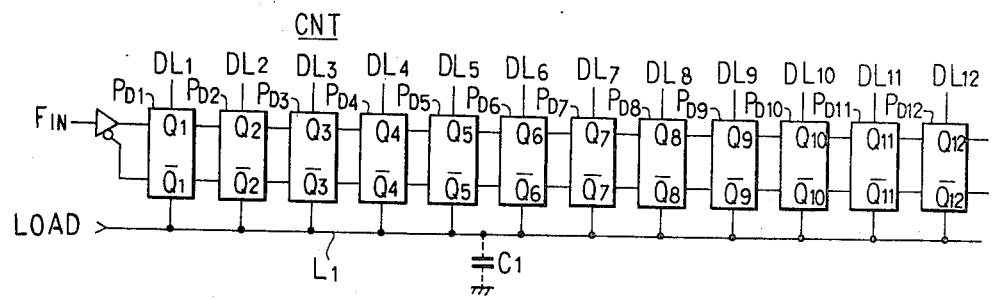
FIG. 1 is a block diagram showing a conventional programmable counter.
Figure 2:
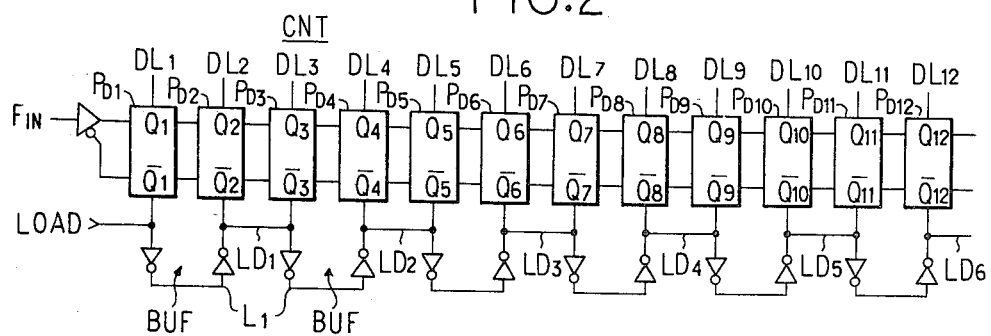
FIG. 2 is a block diagram showing a programmable counter of the type that buffers are inserted in a load signal line.
Figure 3:
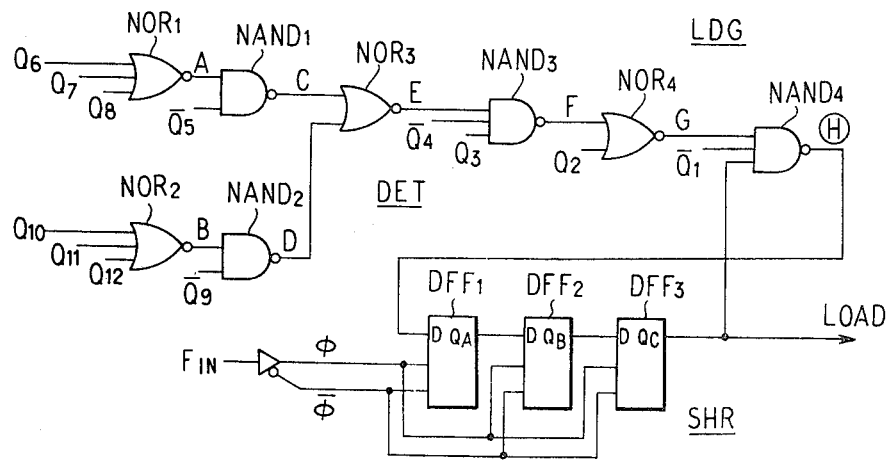
FIG. 3 is a block diagram illustrating an example of a prior art load signal generator circuit.
Figure 4:
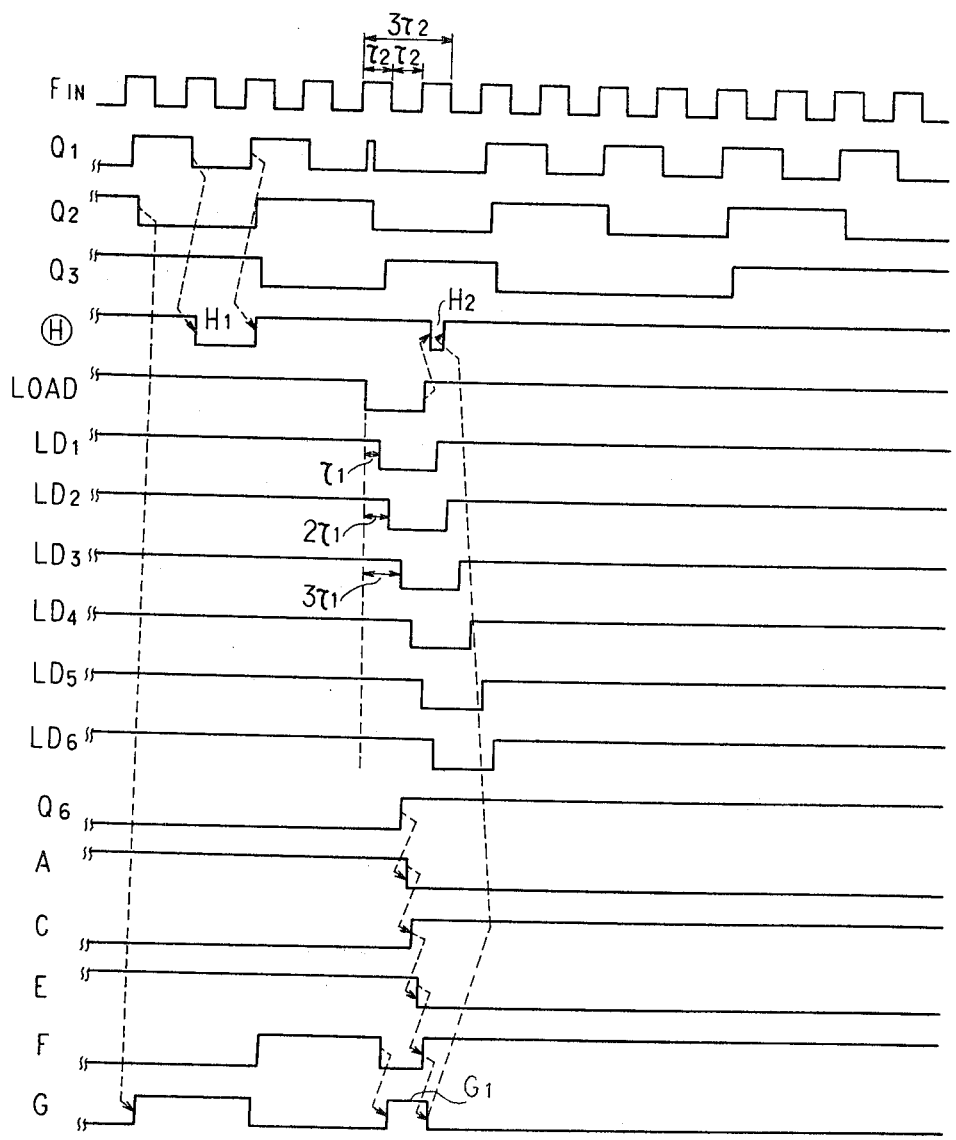
FIG. 4 is a waveform diagram explanatory of the operation of the programmable counter of FIG. 1 combined with the circuit of FIG. 3, showing the case in which the number to be loaded is not a certain specific value.
Figure 5:
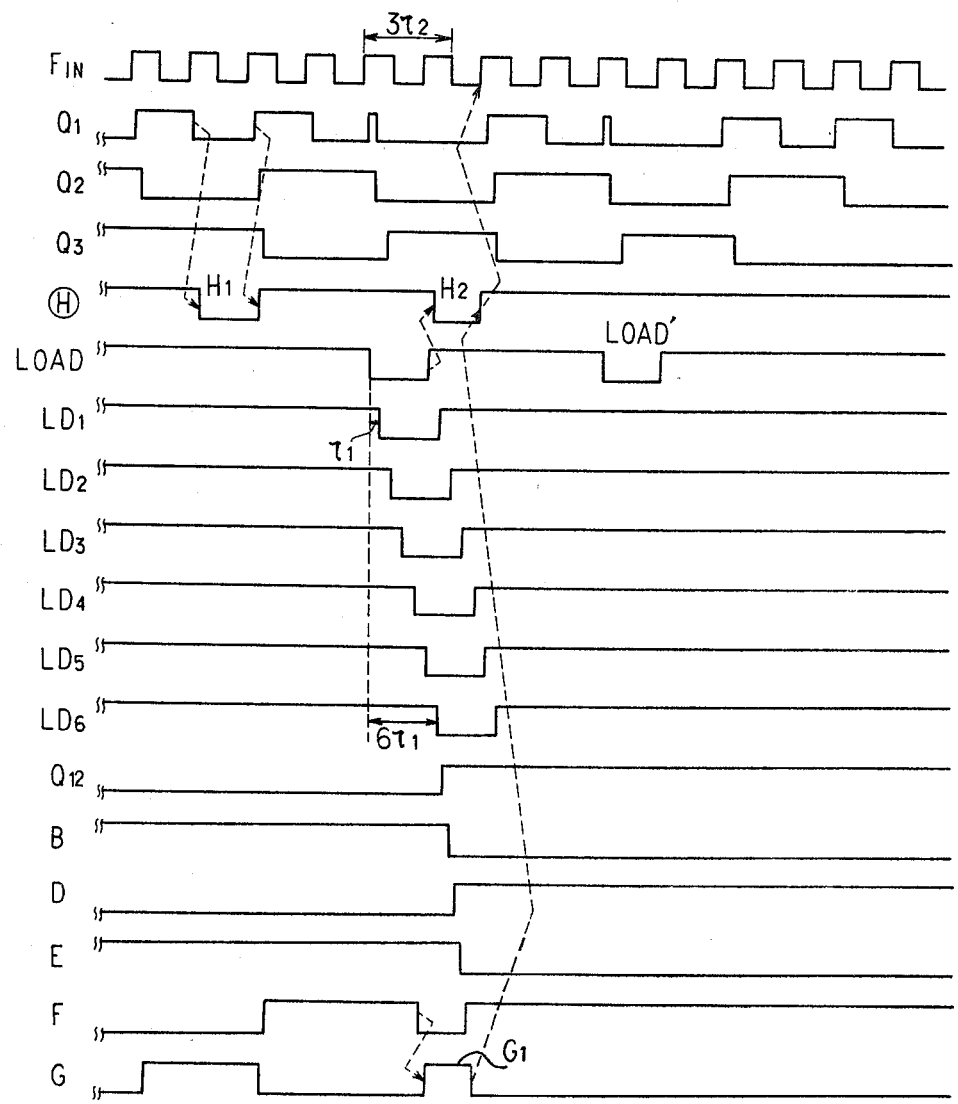
FIG. 5 is a waveform diagram, similar to FIG. 4, showing the case in which data to be loaded is "1" in $DL_3$ and "1" in a high-order bit ($DL_{12}$ in this example)
Figure 7:
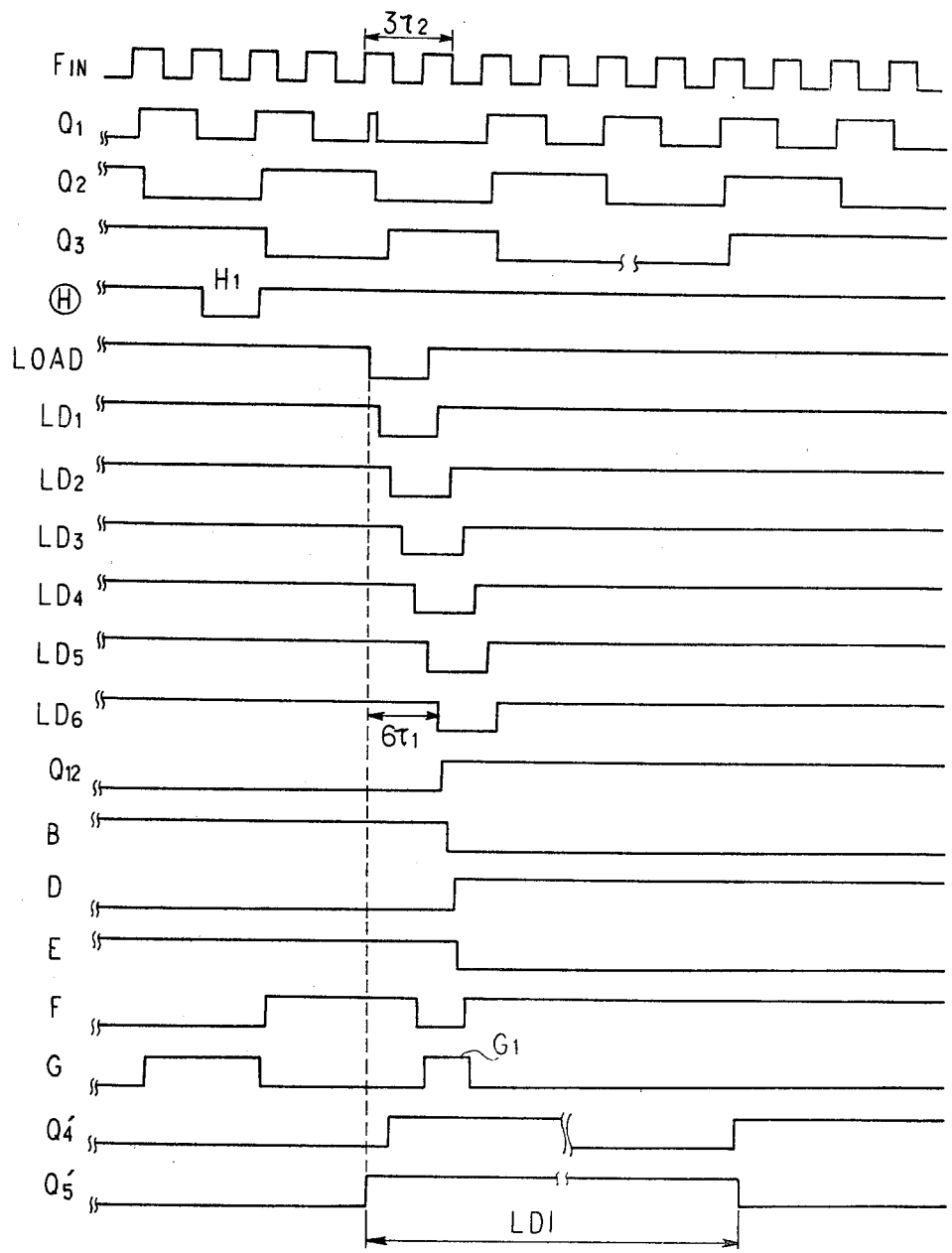
FIG. 7 is a waveform diagram explanatory of a programmable counter circuit of the present invention which is a combination of the circuits of FIGS. 2 and 6.

The flip-flop $P_{D13}$ of the first stage of the load control circuit LCT is connected to the outputs $Q_3$ and $\overline{Q_3}$ of the flip-flop $P_{D3}$ of the counter circuit CNT of FIG. 2. The flip-flop $P_{D13}$ is identical in construction with the flip-flops $P_{D1}$, $P_{D2}$, . . . of the counter circuit CNT and inverts its output upon each application of the clock signal. The flip-flop $P_{D14}$ at the output stage has its input circuit specially arranged and, when loaded with an initial value, produces an output "1" and inverts the output to "0" upon application of one clock signal pulse, thereafter retaining the output "0". Reference character $V_{DD}$ indicates a power supply for loading an initial value "1" in the flip-flops $P_{D13}$ and $P_{D14}$. The timing of loading the initial value is the timing of the load signal LOAD for the flip-flop $P_{D14}$ and the timing of the $LD_1$ for the flip-flop $P_{D13}$, however this may also be the timing of a further signal as $LD_2$. With such an arrangement, as shown by the waveform diagrams of FIG. 7 (which shows an example of loading "1" in $Q_3$ and $Q_{12}$ as is the case with FIG. 5), when the load signal LOAD becomes "0", the outputs $Q_5'$ and $\overline{Q_5'}$ immediately become "1" and "0", respectively. This closes the NAND gate $NAND_4$ from the moment of generation of the load signal LOAD, preventing the application of a low-level signal from the NAND gate $NAND_4$ to the shift register SHR. A period LDI during which the output $Q_5'$ is "1" is a load signal inhibit period. Next, at the time of the low level of $LD_1$ the flip-flop $P_{D13}$ is loaded with "1" and this state is retained until the outputs $Q_3$ and $\overline{Q_3}$ from the flip-flop $P_{D3}$ of the counter CNT vary. When the outputs $Q_3$ and $\overline{Q_3}$ serving as clock signals vary, the flip-flop $P_{D13}$ is inverted to render its output $Q_4'$ the low-level and $\overline{Q_4'}$ the high-level. Accordingly, the flip-flop $P_{D14}$ is inverted by the next clock signal making its output $\overline{Q_5'}$ the high-level in order to open the NAND gate $NAND_4$, deriving therefrom an output which is dependent on its inputs G and $\overline{Q_1}$. In this way, in the present circuit the output from the NAND gate $NAND_4$ is made the high-level forcibly for a certain period of time in order to inhibit the generation of a second load signal. The period of inhibition may be a period lasting until the output from the NAND gate $NAND_4$ is made the high-level by the bit "1" of the initial value to be loaded and this period need not be very long. Accordingly, the clock signal for the flip-flop $P_{D13}$ can be derived from the output of a flip-flop of a stage preceding $P_{D3}$ of the counter. When this clock signal is obtained from the flip-flop of a stage near the last stage of the counter, the value N of the N-step counter cannot be allowed to be small. For example, when the outputs $Q_3$ and $\overline{Q_3}$ are used as described above, if the counter circuit has a 12-bit configuration, the frequency dividing ratio is within the range of 16 to 4095; similarly, if the outputs $Q_4$ and $\overline{Q_4}$ are used, the frequency dividing ratio ranges from 32 to 4095. The clock signal for the flip-flop $P_{D13}$ is selected, taking this into account. This is also related to the number of stages of the load control circuit; that is, the application of the outputs $Q_3$ and $\overline{Q_3}$ to a first one of the two stages of flip-flops of the load control circuit LOT is equivalent to the application of the outputs $Q_4$ and $\overline{Q_4}$ to the second stage of the two stages of flip-flops.

Figure 8:
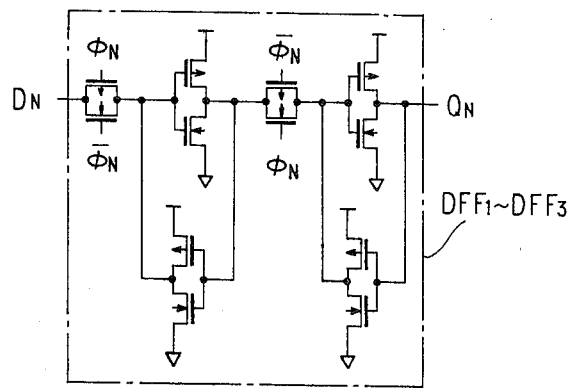
FIG. 8 is a circuit diagram illustrating a specific example of each of D type flip-flops $DFF_1$ to $DFF_3$.
Figure 9:
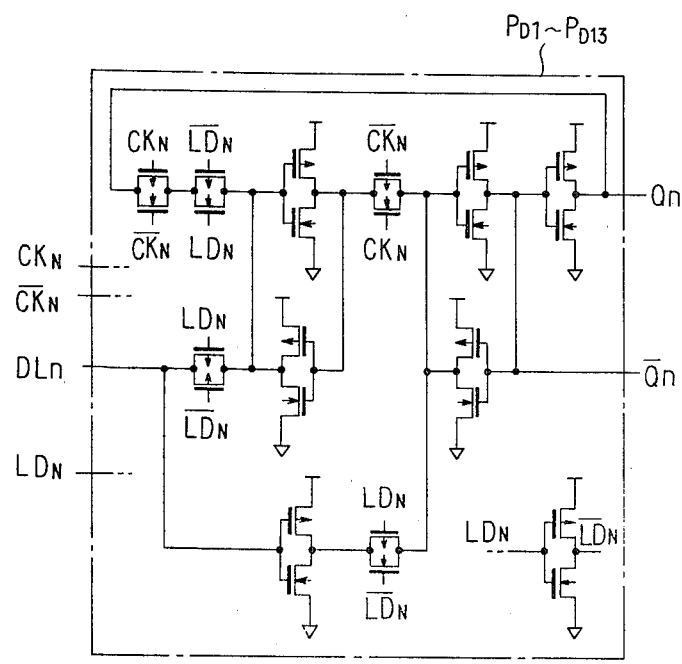
FIG. 9 is a circuit diagram illustrating a specific example of each of flip-flops $P_{D1}$ to $P_{D13}$.
Figure 10:
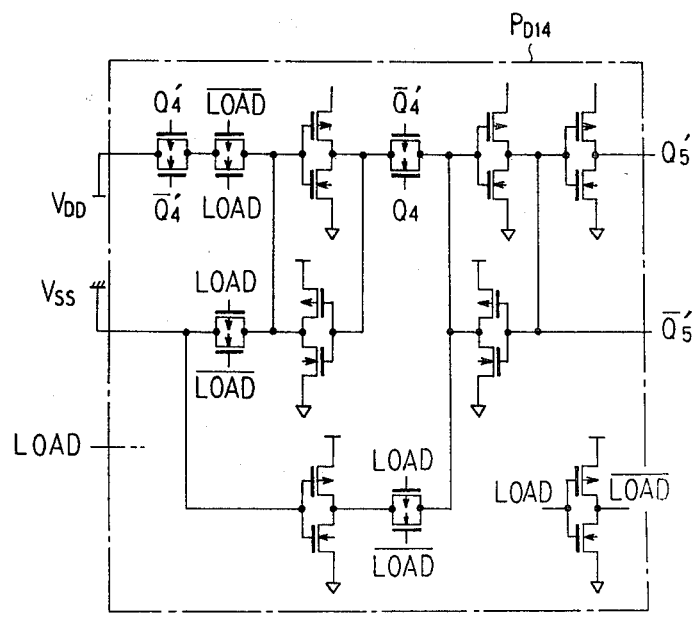
FIG. 10 is a circuit diagram illustrating a specific example of a flip-flop $P_{D14}$.

FIG. 8 illustrates a specific circuit arrangement for each of the D flip-flops $DFF_1$ to $DFF_3$; FIG. 9 illustrates a specific circuit arrangement for each of the flip-flops $P_{D1}$ to $P_{D13}$; and FIG. 10 illustrates a specific circuit arrangement for the flip-flop $P_{D14}$. Since they are known circuit arrangements which comprises C-MOS inverters and transfer gates, no detailed description will be given. Each of the flip-flops $P_{D1}$ to $P_{D13}$ feeds back its output $Q_n$ to an invert input terminal, so that it inverts its state upon each application of a clock signal $CK_N$. In contrast thereto, since the flip-flop $P_{D14}$ does not have such a feedback route and has one of its inputs connected to a high potential power supply $V_{DD}$ and the other input connected to a low potential power supply $V_{SS}$, it yields an output "1" upon loading an initial value and produces an output "0" upon application of a clock signal and thereafter retains the output "0" no matter how many clock signals are applied.

It will be apparent that many modifications and variations may be effected without departing from the scope of the novel concepts of this invention.

What is claimed is:

1. A programmable counter circuit, operatively connectable to receive a clock signal, comprising:
   a counter circuit, operatively connectable to receive the clock signal, having stages, each stage including a flip-flop, each flip-flop having an output, in which an initial value including a specified value is loaded;
   a buffer operatively connected to said counter circuit; and
   a load signal generator, operatively connected to said buffer, for generating a load signal which is applied by said load signal generator through said buffer to the flip-flop of each stage of said counter circuit and which loads the initial value into said counter circuit, so that said programmable counter circuit serves as an N-step counter dependent on the initial value loaded, wherein said load signal generator comprises:
   a detector circuit, operatively connected to the output of each flip-flop of each stage of said counter circuit, for detecting the specified value which is provided a short time before the initial value loading of said counter circuit and for generating a detected output signal;
   a shift register, operatively connected to said detector circuit and operatively connectable to receive the clock signal, said shift register shifting upon reception of the detected output signal from said detector circuit, the shifting controlled by the same clock signal as that for driving the counter circuit and said shift register generating the load signal at the moment of the initial value loading of the counter circuit; and
   a load control circuit, operatively connected to said counter circuit, for sending out a load inhibit signal and for preventing the application of the output from the detector circuit to said shift register for the duration of the load signal and a predetermined period of time subsequent to the load signal.

2. A programmable counter circuit according to claim 1, wherein said programmable counter circuit has a first dividing ratio, wherein said load control circuit comprises:
   a first flip-flop operatively connected to the output from that one of the flip-flops of said counter circuit corresponding to its first dividing ratio and to which the output is applied as a first flip-flop clock signal to set said first flip-flop timing a predetermined delay behind the load signal and having a first flip-flop output; and
   a second flip-flop, operatively connected to the first flip-flop output of said first flip-flop and to which the first flip-flop output is applied as a second flip-flop clock signal, operatively connected to said shift register, for receiving the load signal, so that said second flip-flop is set by the load signal and, after being reset by the second flip-flop clock signal, retains its reset state, said second flip-flop having an output, and so that detected output signal input to said shift register is inhibited by the output of said second flip-flop.

3. A programmable counter circuit according to claim 2, wherein said programmable counter circuit includes a first level potential power supply and a second level potential power supply, wherein the second flip-flop comprises a C-MOS flip-flop circuit having one input operatively connected to the first level potential power supply, having another input operatively connected to the second level potential power supply, having an invert input terminal, having an output and having no feedback route operatively connected between the output and the invert input terminal.

4. A programmable counter circuit, operatively connectable to receive an initial value, comprising:
   counter means, operatively connectable to receive the initial value, for loading the initial value and counting a number of times equal to the initial value and for generating flip-flop signals having a first level and a delayed load signal; and load signal generation means, operatively connected to said counter means, for generating only one load signal each time said counter means counts for the number of times equal to the initial value, whereby said counter loads the initial value when the load signal is output by said load signal generation means, said load signal generation means comprising:

a shift register circuit, having a first input and having an output operatively connected to said counter means, for generating the load signal;

a load control circuit, having first, second and third inputs operatively connected to said counter means, having a fourth input operatively connected to the output of said shift register circuit, and having an output, for receiving the flip-flop signals, and for generating a load inhibit signal having a first level whenever the delayed load signal is detected and for a predetermined period after detecting the load signal; and a count value detector circuit, having data inputs each operatively connected to said counter means, having an inhibit input operatively connected to the output of said load control circuit, having an output operatively connected to the first input of said shift register, for generating a detection signal whenever all of the flip-flop signals received by said count value detector circuit are of the first level and the load inhibit signal is of the first level, so that only one load signal is generated each time said counter means counts for the number of times equal to the initial value.

5. A programmable counter circuit according to claim 4, wherein said load control circuit comprises:

a first flip-flop having a load control initial value input operatively connected to a reference voltage, having first and second inputs operatively connected to said counter circuit, having a load input operatively connected to said count circuit and having first and second outputs; and a second flip-flop, having a load control initial value input operatively connected to the reference voltage, having first and second inputs operatively connected to the first and second outputs of said first flip-flop, respectively, having a load input operatively connected to the output of said shift register, having an output operatively connected to the inhibit input of said count detector circuit, for generating the load inhibit signal whenever the load signal is received and for a predetermined period after the load signal is received.

6. A programmable counter circuit according to claim 5, wherein said load control circuit is operatively connectable to receive a buffer clock signal including buffer clock pulses, wherein said first flip-flop of said load control circuit generates a first flip-flop signal and has an invert input, wherein said first flip-flop has the second output operatively connected to the invert input, so that the first flip-flop output signal is inverted upon receipt of each buffer clock pulse.

7. A programmable counter circuit according to claim 5, wherein said load control circuit is operatively connectable to receive the clock signal containing clock pulses, wherein the load inhibit signal has first and second levels, wherein said second flip-flop of said load control circuit generates the load inhibit signal of the second level upon loading of the initial value into said counter means, said second flip-flop generates the load inhibit signal of the first level after the initial value is loaded into said counter means and one of the clock pulses is received and said second flip-flop generates the load inhibit signal of the first level until the initial value is loaded into said counter means again.

8. A programmable counter according to claim 4, wherein said shift register is operatively connectable to receive a clock signal, wherein said counter means has a load input, wherein said shift register comprises:

a NOT circuit operatively connectable to receive the clock signal, having an output, for generating a NOT clock signal;

a first flip-flop having a first input operatively connected to the output of said count value detector circuit, having a second input operatively connectable to receive the clock signal, having a third input operatively connected to the output of said NOT circuit and having an output;

a second flip-flop having a first input operatively connected to the output of said first flip-flop, having a second input operatively connectable to receive the clock signal, having a third input operatively connected to the output of said NOT circuit and having an output; and a third flip-flop, having a first input operatively connected to the output of said second flip-flop, having a second input operatively connectable to receive the clock signal, having a third input operatively connected to the output of said NOT circuit and having an output operatively connected to the fourth input of said load control circuit and to the load input of said counter means, for generating the load signal.

9. A programmable counter circuit according to claim 4, wherein said programmable counter is operatively connectable to receive a clock signal, wherein said counter means comprises:

a NOT circuit, operatively connectable to receive the clock signal, for generating, as an output, a NOT clock signal;

N flip-flops, where N is an integer greater than or equal to 2, each having first and second inputs, each having a load input, each having initial data inputs and each having first and second outputs, for generating flip-flop signals having first and second levels, wherein the first of said N flip-flops has the first input operatively connectable to receive the clock signal and the second input operatively connected to the output of said NOT circuit to receive the NOT clock signal, wherein the first and second outputs of the N-1th flip-flop operatively connected to the first and second inputs of the Nth flip-flop, respectively; and N/2 buffer circuits, one of said N/2 buffer circuits operatively connected between the odd numbered load input and the next succeeding even numbered load input of each odd-even pair of said N flip-flops, each of said N/2 buffer circuits having an input and an output, wherein the first of said N/2 buffer circuits operatively connected to receive the load signal, so that the load signal is delayed between the odd numbered and even numbered of said N flip-flops.

10. A programmable counter circuit according to claim 9, wherein each of said N/2 buffer circuits comprises:
- a first NOT circuit having an input operatively connected to the respective load input of the corresponding one of said odd numbered N flip-flops and having an output; and
- a second NOT circuit having an input operatively connected to the output of said first NOT circuit, having an output operatively connected to the load input of the next succeeding corresponding one of said even numbered of said N flip-flops.

11. A programmable counter circuit according to claim 9, wherein the clock signal includes clock pulses, wherein each of said N flip-flops has an invert input, wherein each of said N flip-flops has the second output operatively connected to the invert input, so that the level of the flip-flop signal output by each of said N flip-flops is changed from the first level to the second level or the second level to the first level upon receipt of each clock pulse in dependence upon the previous level of the flip-flop signal.

* * * * *

UNITED STATES PATENT AND TRADEMARK OFFICE
CERTIFICATE OF CORRECTION

PATENT NO. : 4,400,615
DATED : August 23, 1983
INVENTOR(S) : Asami et al.

It is certified that error appears in the above-identified patent and that said Letters Patent is hereby corrected as shown below:

Front page, [73] Assignee, "Kanagawa" should be --Kawasaki--.

Column 1, line 25, delete "and".

Column 2, line 3, after "from" insert --the--;
line 54, after "lated" insert --,--.

Column 3, line 12, "low level" should be --low-level--;
line 44, delete ",";
line 47, "short time" should be --little--;
line 49, delete ",";
line 66, "." should be --;--.

Column 4, line 59, after "further" insert --delayed--;
line 59, after "signal" insert --such--;

Column 5, line 2, "low level" should be --low-level--;
line 34, "LOT" should be --LCT--.

Column 7, line 43, "count" should be --counter--.

Signed and Sealed this

Ninth Day of April 1985

[SEAL]

Attest:

DONALD J. QUIGG

Attesting Officer     Acting Commissioner of Patents and Trademarks